US008064209B2

(12) United States Patent
Masucci et al.

(10) Patent No.: US 8,064,209 B2

(45) Date of Patent: Nov. 22, 2011

(54) PORTABLE ASSEMBLY HAVING A SUBSCRIBER IDENTIFICATION MODULE

(75) Inventors: Christopher M. Masucci, Des Moines, IA (US); Kenneth C. Clark, Ankeny, IA (US); David M. Thompson, Hope, ND (US); Michael A. Hajicek, West Fargo, ND (US); Todd A. Braun, Fargo, ND (US); Christopher J. Schmit, Fargo, ND (US)

(73) Assignee: Deere & Company, Moline, IL (US)

( * ) Notice: Subject to any disclaimer, the term of this patent is extended or adjusted under 35 U.S.C. 154(b) by 307 days.

(21) Appl. No.: 12/425,514

(22) Filed: Apr. 17, 2009

(65) Prior Publication Data

US 2010/0265674 A1 Oct. 21, 2010

(51) Int. Cl.
*H05K 5/00* (2006.01)

(52) U.S. Cl. ......................... 361/752; 361/730; 361/800

(58) Field of Classification Search .................. 361/730, 361/752, 790, 797, 796, 800; 312/223.1, 312/223.2

See application file for complete search history.

(56) References Cited

U.S. PATENT DOCUMENTS

| | | | | |
|---|---|---|---|---|
| 4,932,885 | A | 6/1990 | Scholz | |
| 6,175,517 | B1 | 1/2001 | Jigour et al. | |
| 6,431,902 | B1 * | 8/2002 | Yeh | 439/358 |
| 6,808,396 | B2 | 10/2004 | Kawaguchi et al. | |
| 6,816,386 | B2 | 11/2004 | Oguchi et al. | |
| 6,902,435 | B1 | 6/2005 | Cheng | |
| 6,976,879 | B2 | 12/2005 | Shishikura et al. | |
| 7,006,349 | B2 | 2/2006 | Nuovo et al. | |
| 7,114,659 | B2 | 10/2006 | Harari et al. | |
| 7,118,419 | B1 | 10/2006 | Lee | |
| 7,341,198 | B2 | 3/2008 | Nishizawa et al. | |
| 7,448,914 | B2 | 11/2008 | Calvas et al. | |
| 7,510,444 | B2 | 3/2009 | Chang et al. | |
| 7,789,691 | B2 * | 9/2010 | Li et al. | 439/325 |
| 2002/0055291 | A1 | 5/2002 | Maiterth et al. | |
| 2005/0108571 | A1 | 5/2005 | Lu et al. | |
| 2005/0245136 | A1 | 11/2005 | Yin et al. | |
| 2006/0291483 | A1 | 12/2006 | Sela | |
| 2007/0127220 | A1 | 6/2007 | Lippert et al. | |
| 2009/0069048 | A1 | 3/2009 | Yang | |
| 2009/0124126 | A1 | 5/2009 | Cho et al. | |

FOREIGN PATENT DOCUMENTS

| | | |
|---|---|---|
| EP | 0965937 | 12/1999 |
| EP | 1602058 | 12/2005 |

* cited by examiner

*Primary Examiner* — Hung S Bui

(57) ABSTRACT

In accordance with one embodiment, an electrical assembly comprises a housing having a recess in the housing. A first connector portion is securable to the housing. The connector portion comprises a dielectric body and connector terminals. A subscriber identification module is located in or mounted in the housing and has device terminals. A substrate comprises a first section that intersects at an angle a second section. The first section comprises first conductive traces electrically connected to the device terminals. The second section comprises second conductive traces electrically connected to the connector terminals. Conductors are electrically connected to the first conductive traces and the second conductive traces.

16 Claims, 3 Drawing Sheets

PORTABLE ASSEMBLY HAVING A SUBSCRIBER IDENTIFICATION MODULE

FIELD OF THE INVENTION

This invention relates to a portable assembly having a subscriber identification module.

BACKGROUND OF THE INVENTION

Subscriber identification modules are used in wireless transceivers to assign unique identifiers for each subscriber or user of the wireless transceiver. Further, the subscriber identification module may be associated with a network service provider or a wireless access provider or the level of service available for a particular subscriber. Accordingly, there is need for a portable assembly having a subscriber identification module for reliably adding a subscriber identification module to a wireless device or transceiver, consistent with resistance to shock, vibration, and thermal stress.

SUMMARY OF THE INVENTION

In accordance with one embodiment, an electrical assembly comprises a housing having a recess in the housing. A first connector portion is securable to the housing. The connector portion comprises a dielectric body and connector terminals. A subscriber identification module is located or mounted in the housing and has device terminals. A substrate comprises a first section that intersects at an angle to a second section (e.g., the first section is generally orthogonal to a second section). The first section comprises first conductive traces electrically connected to the device terminals. The second section comprises second conductive traces electrically connected to the connector terminals. Conductors are electrically connected to the first conductive traces and the second conductive traces.

DESCRIPTION OF THE PREFERRED EMBODIMENT

Figure 1A:
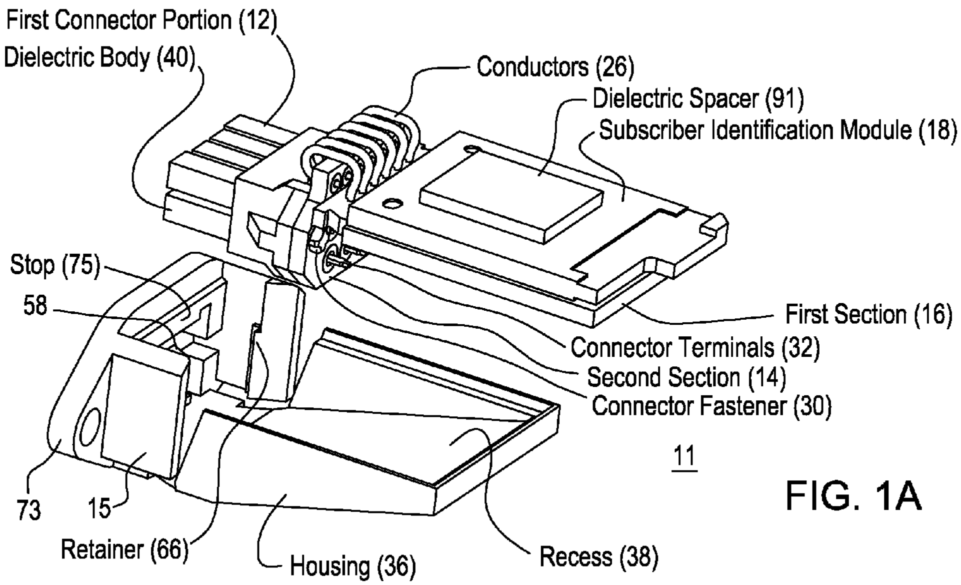
FIG. 1A is an exploded perspective view of a first embodiment of an assembly having a subscriber identification module.
Figure 1B:
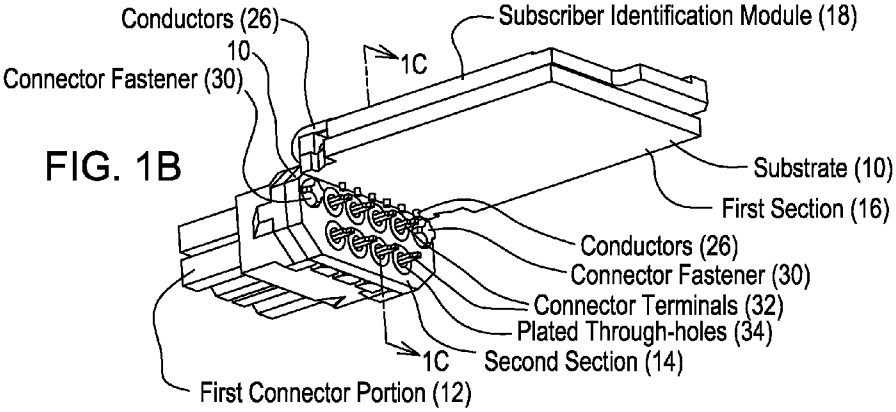
FIG. 1B is a perspective view of the first embodiment of the assembly in accordance with FIG. 1A.
Figure 1C:
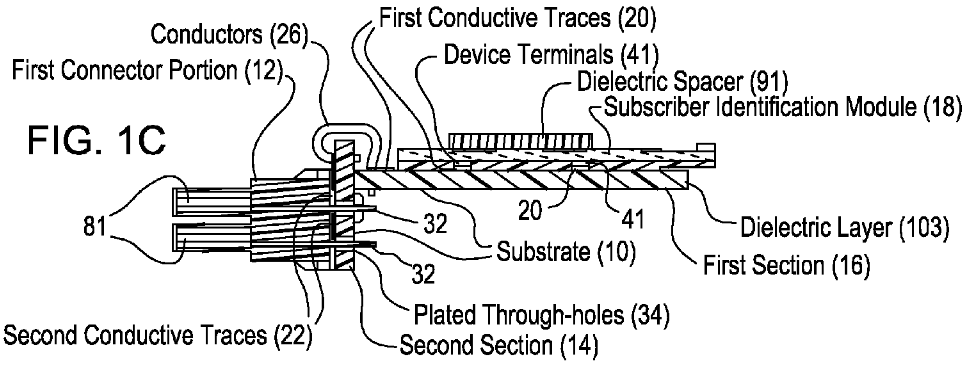
FIG. 1C is a cross-sectional view of the assembly as viewed along reference line 1C-1C of FIG. 1B.
Figure 1D:
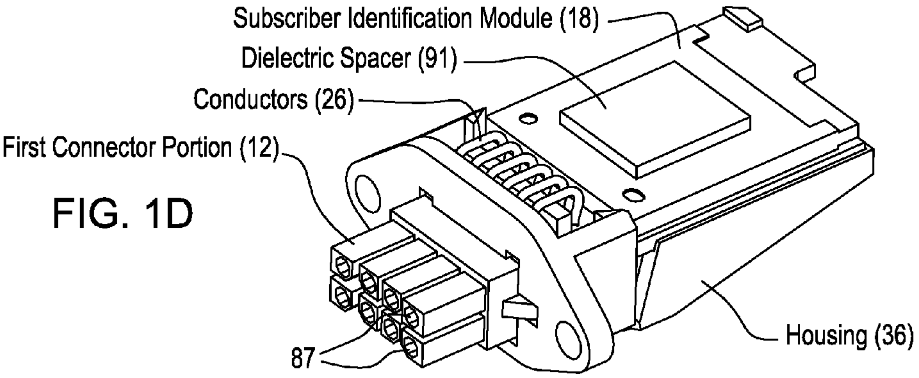
FIG. 1D is another perspective view of the first embodiment of an assembly in accordance with FIG. 1A.

In accordance with a first embodiment of the assembly 11, FIG. 1A, FIG. 1B, FIG. 1C, and FIG. 1D illustrates an electrical assembly 11 that comprises a housing 36 having a recess 38 in the housing 36. A first connector portion 12 is securable to the housing 36. The first connector portion 12 comprises a dielectric body 40 and connector terminals 32. A subscriber identification module (SIM) 18 is located in or mounted the housing 36 and has device terminals 41 (FIG. 1C). A substrate 10 comprises a first section 16 that intersects at an angle to a second section 14 or that is generally orthogonal to a second section 14. The first section 16 comprises first conductive traces 20 electrically connected to the device terminals 41. The second section 14 comprises second conductive traces 22 electrically connected to the connector terminals 32. A plurality of conductors 26 are electrically connected to the first conductive traces 20 and the second conductive traces 22 to facilitate interconnection of the device terminals 41 to the connector terminals 32.

The housing 36 includes a recess 38 and a retainer 66 for securing the substrate 10 and first connector portion 12 to the housing 36. The housing 36 comprises a frame portion 15 with one or more flanges 73 extending (e.g., radially) from the frame portion 15. The flange 73 is arranged for securing the housing 36 and the assembly 11 to a mounting surface via fasteners, adhesive bonding or otherwise, for example. The frame portion 15 has an interior 58 associated with the retainer 66.

Figure 1E:
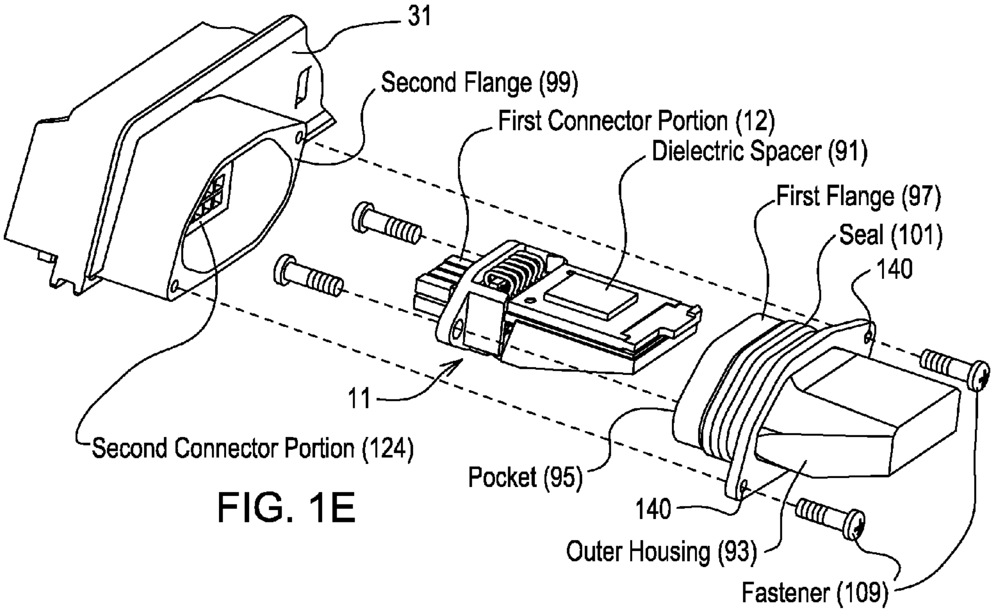
FIG. 1E is another exploded perspective view of the first embodiment of the assembly in accordance with FIG. 1A.
Figure 1F:
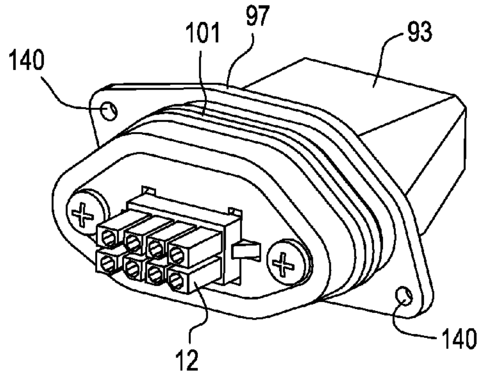
FIG. 1F is an alternate perspective view of the assembly.

The electrical connector comprises a first connector portion 12 that mates with a second connector portion 124 (FIG. 1E). Each connector portion (12, 124) comprises a dielectric body 40 (FIG. 1A) and conductors 81 (FIG. 1C) having connector terminals 32 and mating terminals 87. The mating terminals 87 of the first connector portion 12 physically contact and electrically contact the mating terminals of the second connector portion 124 to allow the reliable transmission of electrical signals within the voltage and current ratings of the connector. The first connector portion 12 may comprise a first plug or a first socket, whereas the second connector portion 124 comprises a second plug or second socket that is compatible with or interlocks with the first connector portion 12. In one embodiment, the electrical connector supports a group of conductor terminals for a subscriber identification module (SIM) 18. For example, the group of conductor terminals may comprise one or more of the following: a reset input terminal, a clock input terminal, a ground terminal, a clock output terminal, a data input terminal, a data output terminal, and power input. The input and output terminals may be arranged for serial input or output of digital signal levels, for example.

The second connector portion 124 may be mounted in or on a mounting surface 31 or wall of an electronic device (e.g., wireless transceiver) or on a chassis.

In an alternate embodiment, the second connector portion 124 may comprise a surface mount device or a device designed for through-hole mounting, or otherwise on a substrate (e.g., circuit board) of an electronic device.

The subscriber identification module (SIM) 18 comprises an electronic device that is capable of communication with a wireless transceiver or terminal. In one embodiment, the SIM 18 comprises electronic memory (e.g., nonvolatile random access memory) and a card interface circuit (e.g., logic circuit) for wireless transceivers or terminals. For example, the SIM 18 may comprise a smart card that supports storage and retrieval of user data. The SIM 18 device may facilitate storage of user data, such as a user identifier, user location, user phone number, network authorization data, user contact lists, stored text messages, user security data, and user passwords. The SIM 18 device may provide a personality to the associated electronics device based on the data stored within the SIM 18, where the personality tailors the electronics device to particular user preferences, particular user data, particular user settings, a particular selection of user programmable features, or particular functionality.

The SIM 18 is associated with a group of device terminals 41. For example, the group of device terminals 41 may comprise one or more of the following: a reset input terminal, a clock input terminal, a ground terminal, a clock output terminal, a data input terminal, a data output terminal, and power input.

In one embodiment, the SIM 18 is mounted within an interior 58 of the housing 36 or frame portion 15 of the housing 36 within the recess 38. In a first example of the retainer 66, the combination of the SIM 18, the substrate 10, and the first connector portion 12 form a module that may be inserted into the interior 58 while the retainer 66 (e.g., snap-fit connectors) is generally elastically or resiliently movable (or even temporarily deformable). Once the assembly is assembled, one side of the module may rest against stop 75, whereas other opposite side of the module may be retained by retainer 66, which snaps back or returns back to its rest state after generally elastic or resilient deformation. The rest stop 75 may comprise a nib, a shelf or other protrusion in the interior 58 of the housing 36 or the frame portion 15.

The module is snapped, locked or secured into place by the retainer 66 and held captive between at least the stop 75 and the retainer 66. The volume above the SIM 18 is associated with a dielectric spacer 91. The dielectric spacer 91 may comprise foam, a polyurethane foam, an elastomer, an elastic adhesive, a resilient polymer or a resilient plastic that is secured or adhesively bonded to a top of the SIM 18. The dielectric spacer 91 may be slightly compressed by the outer housing 93 (FIG. 1E), when the assembly 11 is placed in the pocket 95 of outer housing 93. The compression of the dielectric spacer 91 may provide vibration dampening for the SIM 18 for improved electronic performance and reliability. In one embodiment as shown in FIG. 1E, the outer housing 93 has a first flange 97 for mating with a second flange 99 associated with the mounting surface 31. The first flange 97 may comprise a seal 101 for sealing the outer housing 93 to the second flange 99 to prevent the ingress of undesirable contaminants such as water, moisture, salt, fog, chemical vapors, foreign materials, or otherwise.

The outer housing 93 collectively with the housing 36 and the dielectric spacer 91 provides a rigid shell that protects the SIM 18 from mechanical or environmental damage and dampens vibrations.

The substrate 10 may comprise a circuit board, such a printed circuit board, a ceramic circuit board, or a fiberglass circuit board. The substrate 10 comprises a dielectric layer 103 and one or more conductive layers. For example, the substrate 10 may comprise a single-sided circuit board or a double-sided circuit board. For single-sided circuit board, the dielectric layer 103 has metallic conductive traces (e.g., 20) on one side of the dielectric layer 103. For a double-sided circuit board, the dielectric layer 103 has metallic conductive traces on opposite sides of the dielectric layer 103.

As shown in FIG. 1C, the substrate 10 comprises a first section 16 that is at an angle to the second section 14 or a first section 16 that is generally orthogonal to a second section 14. The first section 16 and the second section 16 may be molded together or attached by an adhesive. The first section 16 comprises first conductive traces 20 electrically connected to the device terminals 41. The first conductive traces 20 may comprise conductive pads for mounting the SIM 18 with a surface mounting package (e.g., flip-chip) or other device terminals, for example. The second section 14 comprises second conductive traces 22 electrically connected to the connector terminals 32. The second conductive traces may comprise conductive pads for mounting the first connector portion 12 or making a suitable connection to its connector terminals 32. The first conductive traces 20, the second conductive traces 22, or both may be formed by electrodeposition, chemical etching, laser ablation, an adhesive metallic layer, an adhesive metal foil layer, printed circuit board fabrication techniques, or otherwise.

Conductors 36 may comprise insulated wires, uninsulated wires, or another metal or alloy member. The conductors 36 provide an electrical and mechanical connection between the first conductive traces 20 of the first section 16 and the second conductive traces 22 of the second section 14. As shown in FIG. 1C, the conductors 36 are mechanically and electrically connected to the first section 16 of the substrate 10 via metal plated through-holes or conductive vias. Similarly, as shown in FIG. 1C, the conductors are mechanically and electrically connected to the second section 14 of the substrate 10 via metal plated through-holes or conductive vias.

Plated through-holes 34 (or other conductive passageways or strips) electrically connect the connector terminals 32 to the second conductive traces 22 on the second section 14 of the substrate 10. In one embodiment, the plated through holes are formed integrally in or on the substrate 10. Further, the conductive vias or plated through holes 34 may contain connector terminals 32 and solder or and electrically conductive adhesive. The plated through-holes 34 are mechanically and electrically connected to the second conductive traces 22.

The assembly 11 is capable of mounting on a mounting surface 31 with a protrusion or second flange 99 that mates with, interlocks with, or engages a first flange 97 in the outer housing 93. The protrusion may be generally elliptical, annular, or rectangular with rounded edges or have virtually another suitable geometric shape. In one embodiment, the first flange 97 and the second flange 99 are arranged to align the first connector portion 12 and the second connector portion 124 for interlocking engagement as an electrical connector.

The seal 101 may be placed in or in contact with the peripheral recess 18 to seal (e.g., hermetically seal) or to provide protection against the environment, including salt, fog, moisture, or liquids. Further, the seal 101 may prevent the ingress of dirt, debris, salt, water, moisture, or other foreign material into the assembly 11 that might otherwise interfere with the reliable operation of the SIM 18.

In one embodiment, the seal 101 comprises an elastomer, a resilient polymer or resilient plastic material. The first flange 97 supports attachment to the mounting surface 31 via one or more fasteners 109. For example, in one configuration, the outer housing 93 has one or more bores 140 that support attachment of the assembly 11 to the mounting surface 31 via one or more fasteners 109.

Figure 2:
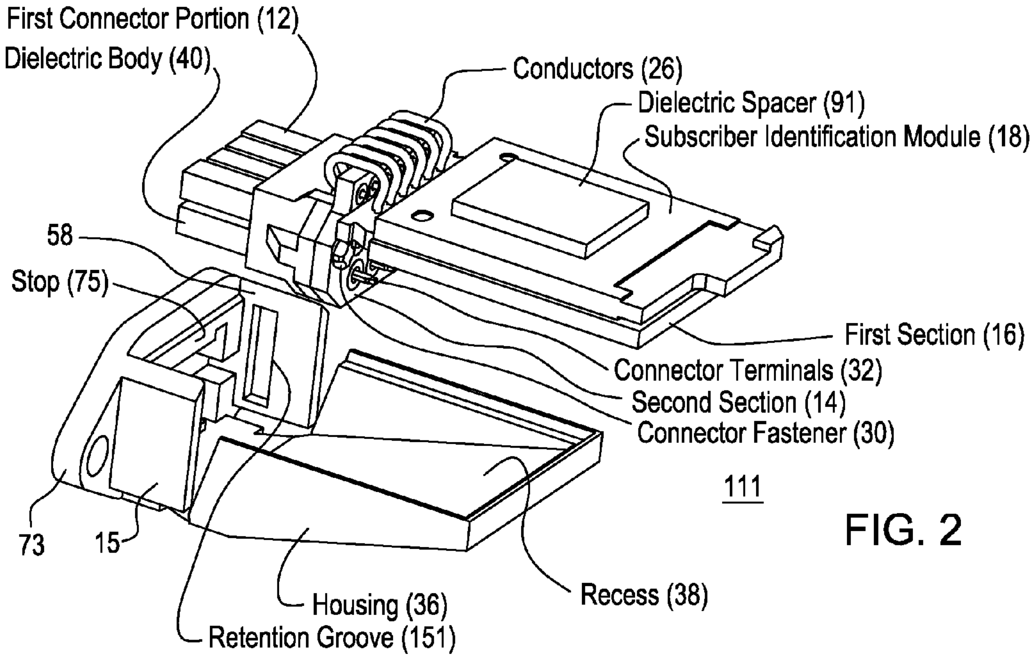
FIG. 2 is a perspective exploded view of a second embodiment of the assembly.

The assembly 111 of FIG. 2 is similar to the assembly 11 of FIG. 1, except the assembly 111 of FIG. 2 further comprises a retention groove 151 or slot in an interior wall of the housing 36 or a frame portion 15 of the housing. As shown in FIG. 2, the retention groove 151 extends from a top of an interior wall to receive the substrate 10, the first connector portion 12, or both. For example, the retention groove 151 may be of a suitable size and shape for receiving a combined edge of a sandwiched substrate 10 and flange (or base) of the first connector portion 12. In another example, the retention groove 151 has a suitable size and shape for receiving an edge of a substrate 10 to secure the substrate 10 within the groove with or without an adhesive. Here, the substrate 10 may be attached to the first connector portion 12 and the SIM 18 as a module, with the edge of the substrate 10 protruding outward from the rest of the module.

Having described the preferred embodiment, it will become apparent that various modifications can be made without departing from the scope of the invention as defined in the accompanying claims.

The following is claimed:

1. An electrical assembly comprising:

a housing;

a recess in the housing;

a first connector portion securable to the housing, the connector portion comprising a dielectric body and connector terminals;

a subscriber identification module in the housing, the subscriber identification module having device terminals;

a substrate comprising a first section that intersects at an angle to a second section, the first section comprises first conductive traces electrically connected to the device terminals and the second section comprising second conductive traces electrically connected to the connector terminals; and a plurality of wire conductors electrically connected to the first conductive traces and the second conductive traces.

2. The assembly according to claim 1 wherein the subscriber identification module is surface mounted on the first section of the substrate and wherein the first connector portion is mounted to the second section of the substrate.

3. The assembly according to claim 1 wherein the first connector portion has a first snap fit connector portion and wherein the recess has a second snap fit connector portion for engaging the first snap fit connector portion to secure the connector and the substrate to the housing.

4. The assembly according to claim 1 further comprising:

an outer housing having a pocket for containing at least the housing, the subscriber identification module and the wire conductors.

5. The assembly according to claim 4 further comprising the outer housing a having a first flange with a sale for mating with a corresponding second flange associated with an electronic device.

6. The assembly according to claim 4 further comprising a retainer for engaging at least one of the housing and the outer housing.

7. The assembly according to claim 1 wherein the wire conductors comprise a plurality of insulated wires that are connected to the conductive traces on the substrate at plated vias or plated through-holes in the substrate.

8. The assembly according to claim 1 wherein the angle comprises a generally orthogonal angle.

9. An electrical assembly comprising:

a housing;

a recess in the housing;

a first connector portion securable to the housing, the connector portion comprising a dielectric body and connector terminals;

a subscriber identification module in the housing, the subscriber identification module having device terminals;

a substrate comprising a first section that intersects at an angle to a second section, the first section comprises first conductive traces electrically connected to the device terminals and the second section comprising second conductive traces electrically connected to the connector terminals; and a plurality of conductors electrically connected to the first conductive traces and the second conductive traces, where the one side of the subscriber identification module is mounted on the first section of the substrate and where an opposite side of the subscriber identification module comprises a dielectric standoff to protect the plurality of conductors from compression from an outer housing.

10. The assembly according to claim 9 wherein the subscriber identification module is surface mounted on the first section of the substrate and wherein the first connector portion is mounted to the second section of the substrate.

11. The assembly according to claim 9 wherein the first connector portion has a first snap fit connector portion and wherein the recess has a second snap fit connector portion for engaging the first snap fit connector portion to secure the connector and the substrate to the housing.

12. The assembly according to claim 9 further comprising:

an outer housing having a pocket for containing at least the housing, the subscriber identification module and the conductors.

13. The assembly according to claim 12 further comprising the outer housing a having a first flange with a sale for mating with a corresponding second flange associated with an electronic device.

14. The assembly according to claim 12 further comprising a retainer for engaging at least one of the housing and the outer housing.

15. The assembly according to claim 9 wherein the conductors comprise a plurality of insulated wires that are connected to the conductive traces on the substrate at plated vias or plated through-holes in the substrate.

16. The assembly according to claim 9 wherein the angle comprises a generally orthogonal angle.

* * * * *